(12) United States Patent
Greco

(10) Patent No.: US 8,756,048 B2
(45) Date of Patent: Jun. 17, 2014

(54) METHOD FOR TECHNOLOGY PORTING OF CAD DESIGNS, AND COMPUTER PROGRAM PRODUCT THEREFOR

(75) Inventor: Giuseppe Greco, Acireale (IT)

(73) Assignee: STMICROELECTRONICS S.r.l., Agrate Brianza (MB) (IT)

( * ) Notice: Subject to any disclaimer, the term of this patent is extended or adjusted under 35 U.S.C. 154(b) by 429 days.

(21) Appl. No.: 13/087,796

(22) Filed: Apr. 15, 2011

(65) Prior Publication Data

US 2012/0265493 A1 Oct. 18, 2012

(51) Int. Cl.
*G06F 13/10* (2006.01)
(52) U.S. Cl.
USPC .......................................................... 703/20
(58) Field of Classification Search
USPC .......................................................... 703/20
See application file for complete search history.

(56) References Cited

U.S. PATENT DOCUMENTS

| | | | |
|---|---|---|---|
| 6,088,518 | A | 7/2000 | Hsu |
| 6,614,430 | B1 * | 9/2003 | Rappoport .................. 345/420 |
| 2010/0229140 | A1 | 9/2010 | Strolenberg et al. |

FOREIGN PATENT DOCUMENTS

| | | |
|---|---|---|
| CN | 101675437 | 3/2010 |
| CN | 101720463 | 6/2010 |
| WO | 2007147826 | 12/2007 |
| WO | 2008031744 | 3/2008 |

OTHER PUBLICATIONS

Dufourd: The Stickizer: A Layout to Symbolic Converter; CH2805-0/89/0000/0534$OI.OO © 1989 IEEE; pp. 534-537.*
Biondi et al. (assignee including inventor: Effect of layout parasitics on the current distribution of power MOSFETs operated at high switching frequency) J Comput Electron (2006) 5:149-153; DOI 10.1007/s10825-006-8835-0.*

* cited by examiner

Primary Examiner — Hugh Jones
(74) Attorney, Agent, or Firm — Graybeal Jackson LLP

(57) ABSTRACT

An embodiment of a design of one or more devices such as e.g. integrated circuits is ported from a source design technology to a target design technology by: —producing a standardized set of porting rules which translate device information related to the device or devices from the source design technology to the target design technology, and —creating a migrated design for the device or devices resulting from porting the CAD design from the source design technology to the target design technology by applying the standardized set of rules to the device information related.

12 Claims, 8 Drawing Sheets

METHOD FOR TECHNOLOGY PORTING OF CAD DESIGNS, AND COMPUTER PROGRAM PRODUCT THEREFOR

TECHNICAL FIELD

One or more embodiments relate to technology porting of CAD (Computer Aided Design) designs.

Certain embodiments may relate to computer-implemented technology porting e.g. in (micro)electronics design environments.

BACKGROUND

In CAD design environments the need may arise of porting a previously developed design from a technology platform to another one.

The increasing complexity of designs as experienced e.g. in the area of microelectronics (for instance in designing Integrated Circuits or ICs) may make this operation rather complex due to the current unavailability of Electronic Design Automation (EDA or EGAD) tools adapted to perform a porting operation in an automatic way while maintaining design kit references.

For instance, certain porting tools available from Sagantec North America of 2075 De La Cruz Blvd, Suite #105, Santa Clara, Calif. 95050 work at the shape level and act only on elementary layout structures (e.g. rectangles, paths, polygons), thus failing to preserve all connections to the reference design kit objects.

U.S. Pat. No. 6,088,518 to Hsu, which is incorporated by reference, discloses a method and system for porting an integrated circuit layout from a reference process to a target process by placing components related to the reference process on a grid determined by equations that are based upon the desired layout architecture. The design rules of the target process are used along with the equations to determine the grid of the target process. The component layout is controlled by parameters, where the design rules provide the values of the parameters so that each component is ported when the parameter values are changed to that of the target process. The locations of the components are eventually mapped grid-point to grid-point from the reference process to the target process, so that an integrated circuit layout in the target process is drawn without design rule violation.

The arrangement of Hsu is applicable to a layout structure only, and operates at the level of (geometrical) shapes and thus needs technological data to re-design the device being migrated.

Also, Hsu fails to provide any links to design libraries and does not refer to any standardization of rules. Additionally, Hsu does not provide the possibility of using the design flows of the target technology so that all information as to parametric cells and connectivity (which may be significant for timing analysis purposes) is lost.

Other documents such as US-A-2010/229140, CN-A-101720463, CN-A-101675437, WO-A-2008/031744, and WO-A-2007/147826, which are incorporated by reference, disclose methods applicable within the framework of a strategy as disclosed by Hsu.

In that respect, it is noted that none of these documents properly relates to migration or porting; these documents primarily relate to layouts for shape-level operations.

SUMMARY

The unavailability of an EDA tool capable of operating e.g. at cell level, ends up by rendering any porting activity difficult and time-consuming; a designer may, in fact, be required to perform the porting operations manually, which may take much time and give rise to undesired errors in defining the correct device parameters. Also, meeting time-to-market requirements may impose very strict time constraints in performing these operations.

Therefore, one or more embodiments provide one or more of the following:

a technology-independent porting tool which may be of generic use for structures, layouts, and schematics, possibly using a single set of rules;

cell-level operating capability, including cell-parameter management and control of associated functions which may impact on other cell parameters (e.g. callbacks);

the ability to maintain links to design kits (e.g. libraries);

the ability to maintain spatial correspondence with respect to the positions of the source components;

the ability to allow operation based on a standardized file of rules;

the ability to retain the capability of using the design flows of the target technology while maintaining information on parametric cells and connectivity, thus permitting proper use of the design flows (DEF generation/timing analysis, layout/schematic connectivity linker, design rule drawing, layout net probing, etc.)

An embodiment may allow mapping of the source and target technologies through a standardized file of rules (Deck rule file) which contains porting information, e.g. as codified at the design stage.

An embodiment may operate on schematic/layout views.

An embodiment may permit an automated porting process through a procedure implemented as a computer program product.

An embodiment may reduce porting/migration time from weeks to hours or even minutes e.g. when a rule file is already available.

An embodiment may be implemented on a computer by resorting to standard software means and tools.

An embodiment may favorably impact a resulting design.

An embodiment may allow porting/migration of schematics and layouts with the same rule file.

An embodiment may allow easy design maintenance, e.g. single or few device updates, parameter fixing, parameter update, re-instantiation.

An embodiment may not require any technology data derived from any Design Rule Manual.

An embodiment may work at levels selected from the top level, hierarchy level, or library level.

An embodiment may dispense with any limits imposed on a designer's flexibility, either in migrating a design from a technology to another one or in effecting modifications in an existing project with the purpose of e.g. substituting components already placed and already connected or modifying certain Component Description Format (CDF) parameters in a large number of components already placed with a correspondingly large number of associated callbacks.

An embodiment may permit effecting fast migrations of cells belonging to layout and schematic views with the possibility of maintaining connectivity throughout migrated cells and leaving to the user the capability of managing some important migrations parameters through the compilation of a source code taken as a tool input.

BRIEF DESCRIPTION OF THE DRAWINGS

One or more embodiments will now be described, purely by way of non-limiting example, with reference to the annexed figures, in which.

DETAILED DESCRIPTION

In the following description, numerous specific details are given to provide a thorough understanding of embodiments. The embodiments may be practiced without one or more of the specific details, or with other methods, components, materials, etc. In other instances, well-known structures, materials, or operations are not shown or described in detail in order to avoid obscuring the description of the embodiments.

Reference throughout this specification to "one embodiment" means that a particular feature, structure, or characteristic described in connection with the embodiment is included in at least one embodiment. Thus, the appearances of the phrase "in certain embodiments", in various places throughout this specification, are not necessarily all referring to the same embodiments. Furthermore, particular features, structures, or characteristics may be combined in any suitable manner in one or more embodiments.

The headings provided herein are for convenience only and do not interpret the scope or meaning of the embodiments.

Figure 1:
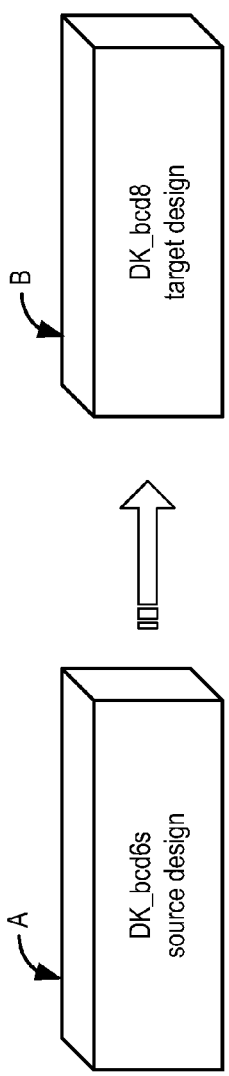
FIG. 1 is generally representative of an embodiment of a porting procedure as considered herein.

FIG. 1 is schematically representative of "porting" a CAD design (e.g. in microelectronics applications such as IC design) from a "source" design technology A to a "target" design technology B.

Figure 2:
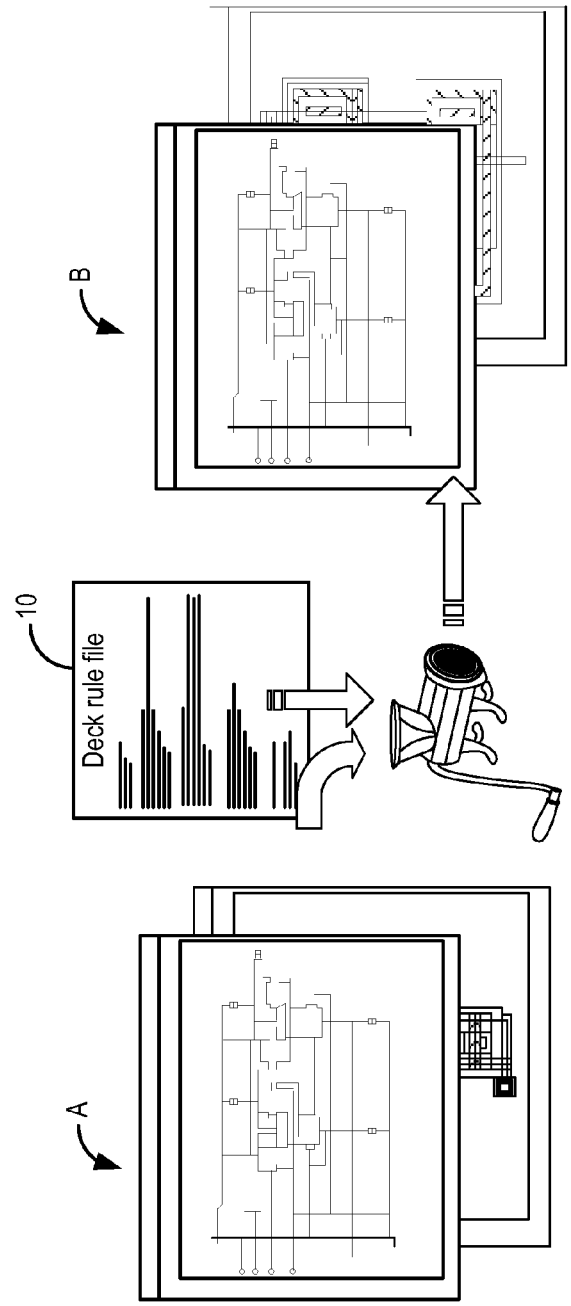
FIG. 2 is representative of embodiments of a porting procedure.

FIG. 2 refers in that respect—by way of example—to an integrated circuit or IC. An IC layout may be defined in the form of polygons being drawn on paper or, as is most often the case today, electronically. The circuit components represented in the form of polygons are arranged in patterns (e.g. as a collection of parameterized shapes) representing the elementary devices and their physical connections. Typical IC manufacturing processes involve the use of plural layers such as e.g. active, contact (e.g. metal), insulation (e.g. $SiO_2$) layers, which are arranged adjacent or on top of each other to produce a desired circuit layout.

In an IC layout, there are a practically boundless variety of ways for arranging these layers, each of these defining an "architecture". Features and details of an architecture may depend more or less extensively on the specific technological process or processes used to produce an IC.

In FIG. 2, two different architectures are schematically illustrated adapted for being implemented by means of a "source" technology A and a "target" technology B.

As indicated, the features and details of an architecture may depend more or less extensively on the specific technological process or processes used. While being adequate for creating an IC layout utilizing technology A, a given architecture may not be adapted for creating that IC layout utilizing technology B.

Consequently, the architecture/layout may be "ported" from the source process/technology A to the target process/technology B.

Various embodiments herein may address the porting problem by creating a set of standardized rules, which may be defined a Deck-rule file 10.

In creating such a file, in addition to possibly providing a header common to all devices, each individual device type (e.g. a MOSFET) is translated as a whole set of Design Kit to Design Kit ("DK-to-DK") mapping rules acting on all device parameters and terminal connectivity.

These rules will constitute a general rule file that will then be processed to create the migrated design.

In certain embodiments, such an approach may involve two steps or phases:

translating device information into a standardized rule deck; and using the rules thus defined for creating the final migrated design.

The following pseudo-code is exemplary of such a possible sequence

```
START_DEV:devices_symbols_DK64b_3m,nmos4,D
TARGET_DEV:devices_symbols,nllmos4,D
TARGET_PARAM:w = max(0.28e-6,P->w/P->l*0.67*max(0.18e-6,P->l*0.18/0.35))
TARGET_PARAM: l = max(0.18e-6,P->l*0.18/0.35)
TARGET_PARAM: extrail = if(equal(substring(sprintf(nil "%s" 'P->CHANNEL) 1 1)
"M") then 25 else 45)
TARGET_PARAM: extrail = if(equal(substring(sprintf(nil "%s" 'P->CHANNEL)
1 1) "L") then 5) #even 12V
TARGET_PARAM: extrail = if(equal(substring(sprintf(nil "%s" 'P->CHANNEL)
1 1) C") then 1.8)...
TARGET_ROT: _MATCH_
MAP_NETS:_MATCH_
```

Figure 3:
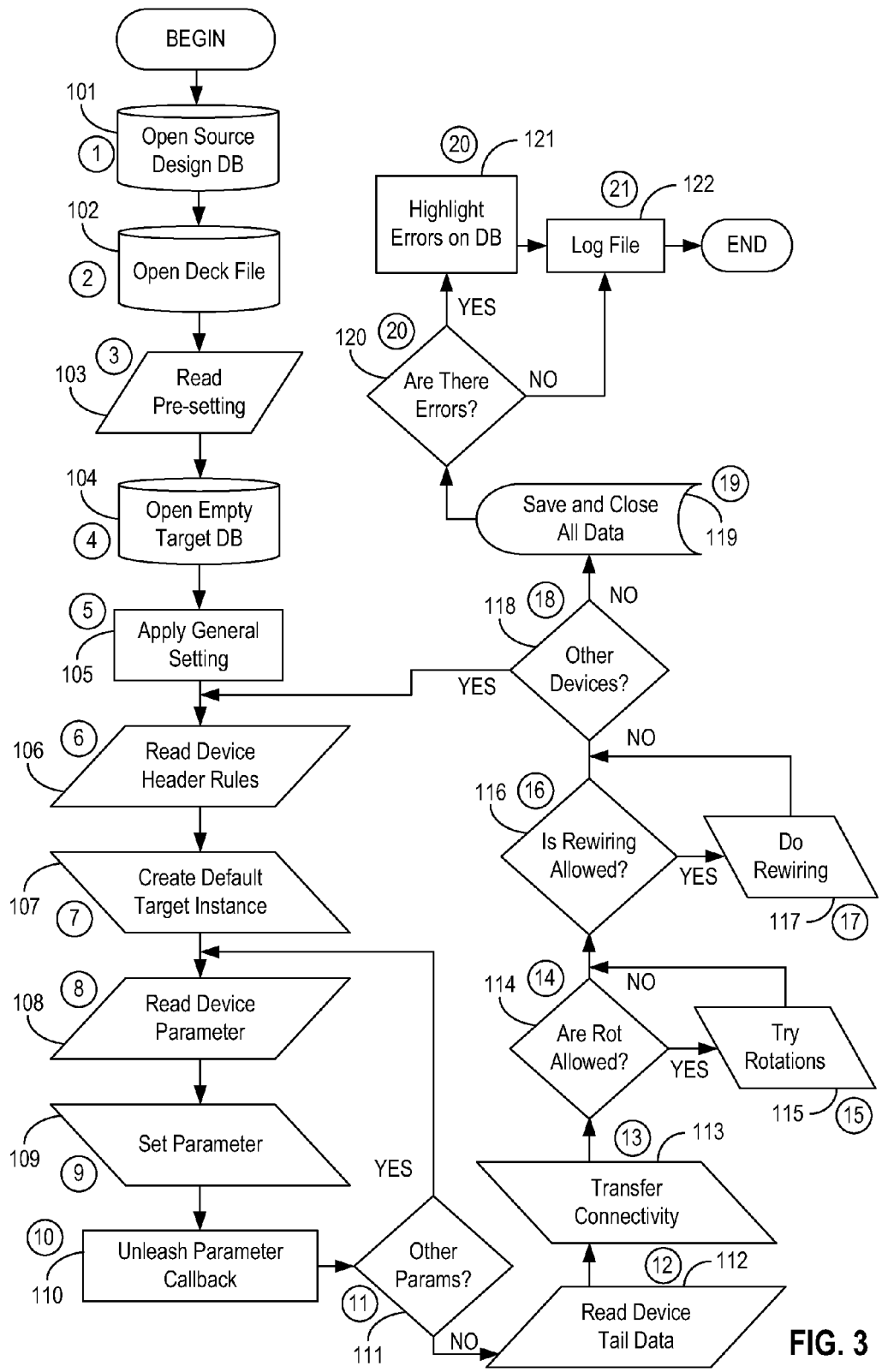
FIG. 3 depicts an exemplary step of an embodiment.

The flow chart of FIG. 3 is exemplary of a sequence of steps in an embodiment.

After an initial Begin step, a read source database containing the design to be migrated is opened in a step 101.

A read deck rule file containing porting instructions (previously created e.g. as better detailed in the following, namely as a function of the layout to be migrated and the source and target technologies) is opened in a step 102.

Headers for common setting concerning all components (operational mode and technology setting) are read in a step 103.

A target database design (empty at first and to be filled as a result of the porting process) is opened in a step 104.

Technology settings in program variables are stored in a step 105.

Once these opening steps are completed, a sequence of steps 106 to 117 may be performed for each device involved in the porting operation.

Specifically, a device header from the deck file containing source/target instance references is read in a step 106.

In a step 107 a (first) target instance is created with default parameters in the target database opened in the step 104.

In a step 108 a parameter setting concerning the treated device is read from the deck file opened in the step 102.

In a step 109 the parameter read is set to the target device and in a step 110 the callback associated to the parameter set is unleashed.

The step 111 is a check intended to verify if other device parameters need to be processed.

If other parameters need to be processed, then the procedure returns to the step 108 and the steps 108 and 109 are repeated for another parameter.

If no other parameters need to be processed, that is after all parameters are set, then connectivity information is read from the rule file in a step 112.

Connectivity is then transferred on the target device in a step 113, after which a check is performed in a step 114 as to whether rotation components are allowed in the case of overlap.

If rotations are allowed, then a (sub)procedure is launched in a step 115 to manage rotation attempts of the cells aimed at avoiding overlaps with other schematic or layout structures. In certain embodiments, these rotation attempts may be based on reference pin alignment.

If all allowed tries specified in the device rule section are tested and errors are detected, an error flag is stored.

If rotations are not allowed, then the procedure evolves directly (i.e. without previously attempting rotations in the step 115) to a step 116 where a check is performed as to whether automatic rewiring operations are allowed.

If automatic rewiring is allowed, then the device wires/paths are deleted and automatically rebuilt in a step 117.

If automatic rewiring is not allowed, then the procedure evolves directly (i.e. without previously performing rewiring in the step 117) to the step 118 where a check is performed as to whether other devices are involved in the porting operations, so that the sequence of steps 106 to 117 may be performed for each device involved in the porting operation.

If no other devices need to be "processed" (i.e. the step 118 yields a negative outcome) all data will be closed and the results comprising the target database are stored in a step 119.

A step 120 will then determine if any errors have been detected in the process (e.g. the error_flag has been set in the rotation step 115). If any errors are detected in the step 120, the target database will be "marked" correspondingly (e.g. through a marker layer) in a step 121 to highlight the device(s) which was(were) not properly translated due to error.

In a step 122 (reached directly from the step 120 or via the step 121 depending on the outcome of the step 120) a log file is produced containing all the necessary migration details.

The following is a description of exemplary porting procedures according to certain embodiments.

Figure 4:
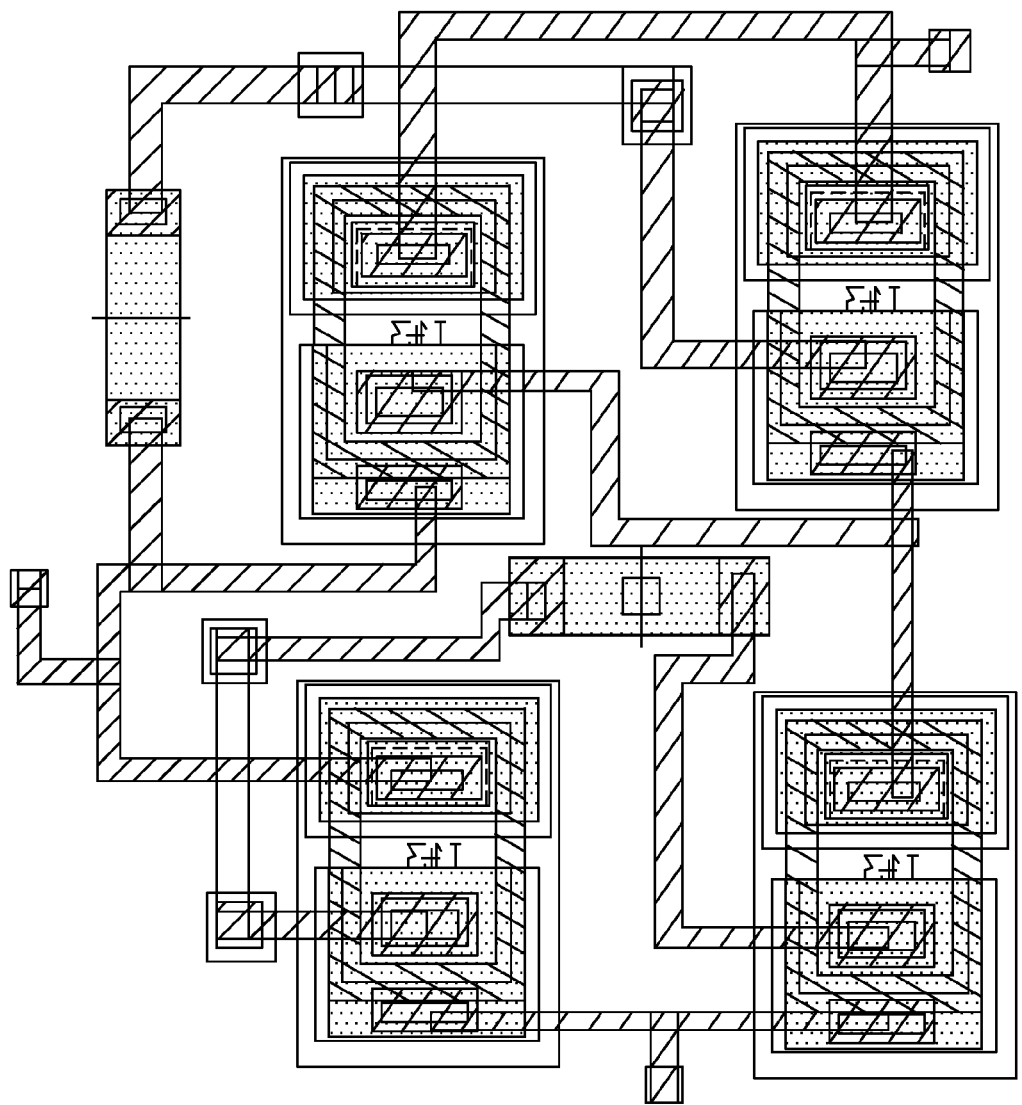
FIG. 4 is a flow chart of an embodiment.

Specifically, one may refer by way of example to the portion of (circuit) layout as shown in FIG. 4 and assume that the four bipolar transistors therein ("npnB") are to be migrated into similar transistors ("npnC") having two base terminals instead of one as is the case for npnB.

For example purpose, one may also assume that a parameter of the new components, e.g. "ModelName", is intended to be modified to "C4", so that the modifications on these parameters may imply unleashing of some callbacks associated with the field.

In a computer-implemented exemplary embodiment of the flowchart of FIG. 3, a tool may be executed through the selection of a menu item "Layout Migrator" or by typing a "migration( )" or "mig( )" message in a corresponding window in a computer display.

Before executing the tool, a rule file may be compiled with e.g. a general template automatically generated by selecting one item in a "Templates" menu.

An example of a rule file adapted to be produced and customized for the exemplary migration purposes considered herein may be as follows.

```
# ---------------
# GENERAL RULES:
# ---------------
ERROR_LAYER = marker/error
TEMP_LAYER = y0
INCLUDE_LAYER = y1
ALLOWED_ROT = 0,90,180,270
VARS: var1 = 10,var2 = 20
# ---------------
# SCHEMATIC SECTION
# ---------------
#If the instance overlaps other instances will not be placed
#and other combinations are tried.
SCH_CHECK_OV = false
#SCH_DELTA_OV = 0
# ---------------
# LAYOUT SECTION
# ---------------
#If the instance overlaps other instances will not be placed
#and other combinations are tried.
LAY_CHECK_OV = false
LAY_DELTA_OV = 0
LAY_CHECK_PIN_OVERLAP = true
REMOVE_CONV_PATH = true
LAY_MAINTAIN_ROUTING = false
METAL_LAYER = metal1,metal2,metal3
VIA_INSTANCES = M1_M2,M2_M3
ALIGN_ORIGIN = false
#If this option is set to false, this special instances will be ignored.
FLAT_MOSAIC_INST = true
# ----------------------
# LAYER MIGRATION RULES
START_LAYER = metal1/drawing
TARGET_LAYER = metal2/drawing
START_LAYER = iso/drawing
TARGET_LAYER = ppl/drawing
END_LAY_RULES
# ----------------------
# DEVICES MIGRATION RULES
# ----------------------
START_DEV:devices_symbols,npnA,B
TARGET_DEV:devices_symbols,npnB,B
TARGET_PARAM: emitter_length = _MATCH_ * var1
TARGET_PARAM: ModelName = strcat("C" substring(_MATCH_ 2 1))
TARGET_ROT: _ALL_
MAP_NETS: _MATCH_
START_DEV:devices_symbols,resistor,PLUS
TARGET_DEV:devices_symbols,capacitor,PLUS
TARGET_ROT: _MATCH_
TARGET_PARAM: c = _MATCH_ * 10
TARGET_PARAM: w = 10
MAP_NETS: PLUS>MINUS,MINUS>PLUS
START_DEV:devices_symbols,resPP,PLUS
TARGET_DEV:devices_symbols,resPP,PLUS
TARGET_ROT: _MATCH_
TARGET_PARAM: r = atof(_MATCH_) * var1
TARGET_PARAM: MinR = _MATCH_ * 2
MAP_NETS: _MATCH_
END_DEV_RULES
```

When the tool starts, a form may be displayed on the computer screen, the fields in the form making it possible to specify the layout intended to be migrated through a selection effected via e.g. a button "Set layout window" by specifying the file rule name in the field e.g. "Mig rules file . . . ".

In an embodiment, four checkboxes may thus be displayed to carry out operations such as:

Selection constraints: if set to "true" the tool may take into account one or more constraints on a limited area of migration whose bounds are specified by a layer defined in the rule file (only for layout migrations);

Create Migration view: if set to "true" this option may cause the tool to create a new view named "migration". If set to "false", instead, the migrated layout may overwrite the old one.

Descend in hierarchy: if set to "true" this option may impose on the tool hierarchy scans of the whole design and possible modifications will be executed on all visited cells.

Display detailed CIW Log: if set to "true" a detailed output log, tied to the operation executed by the tool, may be displayed in an Opus CIW window. If set to "false", in the CIW, only essential information may be displayed.

In an embodiment, three buttons (e.g., physical or on a computer display) may be presented to allow the following operations:

Start Migration . . . : if selected, the migration action will be started as detailed in the following Clear Err Mrk: After the migration action, if some constraints are violated, the tied devices will be highlighted with a marker layer (see step 121 in FIG. 3). This button may make it possible to delete such markers.

Reinstantiate: This button may make it possible to set a rule file useful for the purpose of replacing features or, more generally, for creating a rule template starting from the source design.

Assuming that migration is launched through a "Start Migration . . . " button, the result obtained may be as reported in FIG. 5, which may be automatically generated in a new view named "migration".

The migration may have involved a substitution of components using alignment criteria that will be further detailed in the following when describing in detail the contents of an exemplary rule file.

It will be appreciated that certain components may have been rotated with respect to the original position in order to be placed without overlapping with other structures, while the modification of the parameter "ModelName" has led to a variation in the device "npnC" with respect to the one placed as a default choice.

In various embodiments, the overlaps between the instances and the metal may have been chopped while maintaining the original connectivity.

No pins may have been removed or chopped due to the previous operation because in the exemplary embodiment considered, the tool considers an overlap between pins and instances an inviolable constraint (this is an example of a common header setting).

In certain embodiments, this constraint may be disabled or managed through the commands LAY_CHECK_OV or LAY_DELTA_OV as detailed in the following.

At this point, using an automatic router such as the ICC Custom Router (other routers commonly available may similarly be used) it is possible to connect the chopped metal by following the original connectivity maintained in the layout after the migration step.

Figure 5:
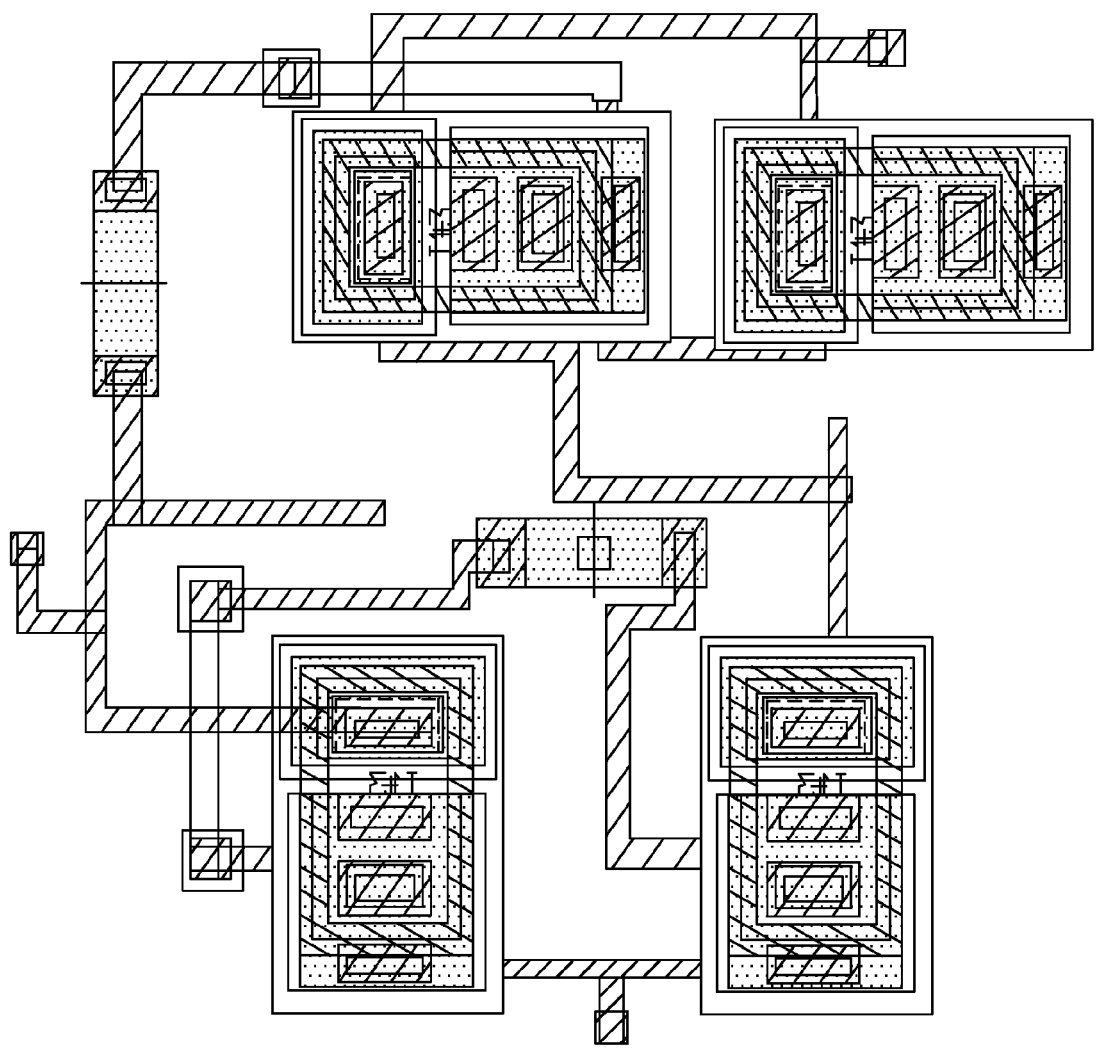
FIGS. 5 to 11 are representative of steps in embodiments.
Figure 6:
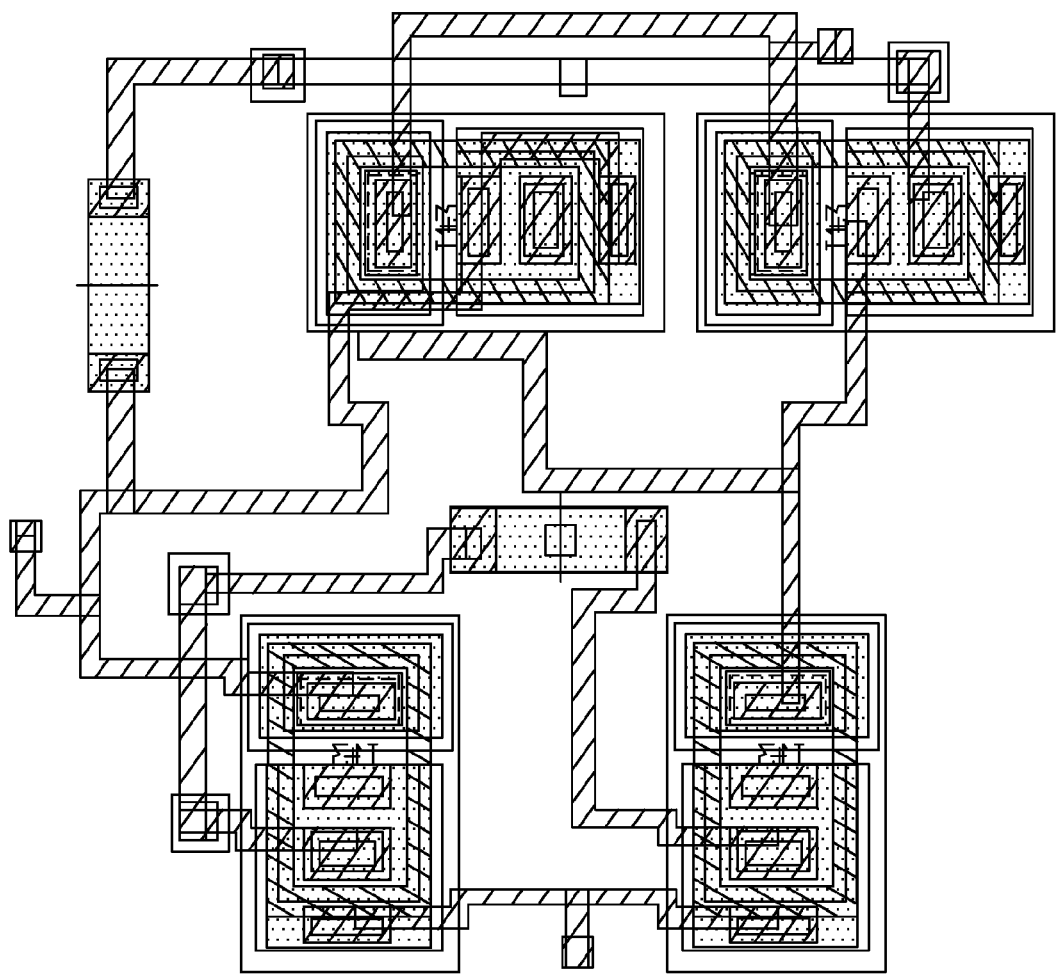

FIG. 6 is an exemplary representation of the portion of layout of FIG. 5 considered herein after migration and rerouting executed by means of a ICC Custom Router.

Figure 7:
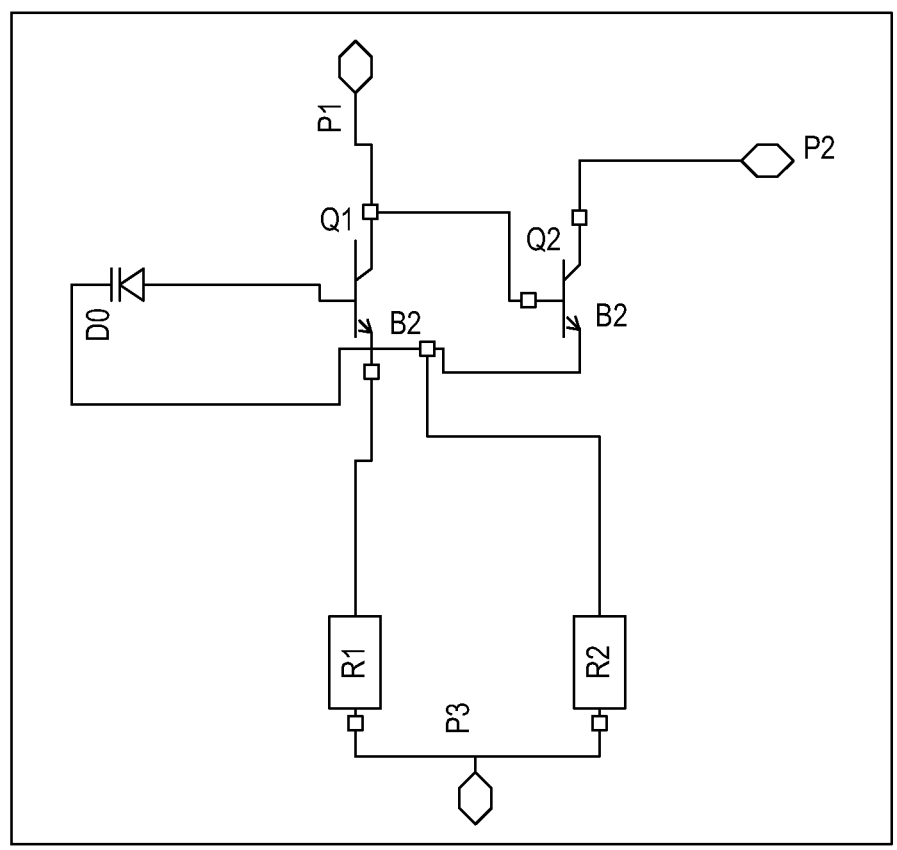

As an example of schematics migration, one may refer to the portion of schematics shown in FIG. 7, by assuming that the bipolar transistors Q1 and Q2 therein are to be migrated to similar transistors named "npnC" with all resistors being replaced with capacitors of the "capMM" type. It will be further assumed that it is desired to modify the parameter "ModelName" of the new transistors to "C4". This parameter modification will once more imply the calling of associated callbacks.

Once again the tool is run (e.g. either through the selection of an item menu "Schematic Migrator" or by entering a "migration schematics" or "migsch( )" command in a corresponding display window CIW) after compiling a rule file whose template may be similar to the one already considered in the foregoing, the possible difference given by the data contained in the section MIGRATION RULES.

```
START_DEV:devices_symbols,npnB,B
TARGET_DEV:devices_symbols,npnC,B
TARGET_ROT:_MATCH_
TARGET_PARAM: ModelName = C4
MAP_NETS:_MATCH_
START_DEV:devices_symbols,resPP,MINUS
TARGET_DEV:devices_symbols,capMM,PLUS
TARGET_ROT:0
MAP_NETS:PLUS>MINUS,MINUS>PLUS
```

Once the tool is started, a form may be displayed on the user interface to permit setting a schematic window to be migrated (this may be through a button "Set schematic window") and the rule file to be loaded (this may be indicated in a field "MigSch rules file . . . ").

In certain embodiments, contrary to the exemplary "Layout Migrator" considered in the foregoing, a possible layer for restricted migration action may not be specified. The functions tied to the other checkboxes may be substantially similar to those discussed in the foregoing with reference to the exemplary "Layout Migrator" option.

A possible exception may be a "Migrate current library" button provided to permit migration of all cells in the current library, treating each single cell in a hierarchical way. In certain embodiments, migration may be run flat and in overwriting mode.

For each cell, all the following views, if present, may be migrated:

"schematic" "cmos_sch" "gate_sch"

When the tool runs in a hierarchical mode, the priority view list used to descend the hierarchy may be the one reported above.

Figure 8:
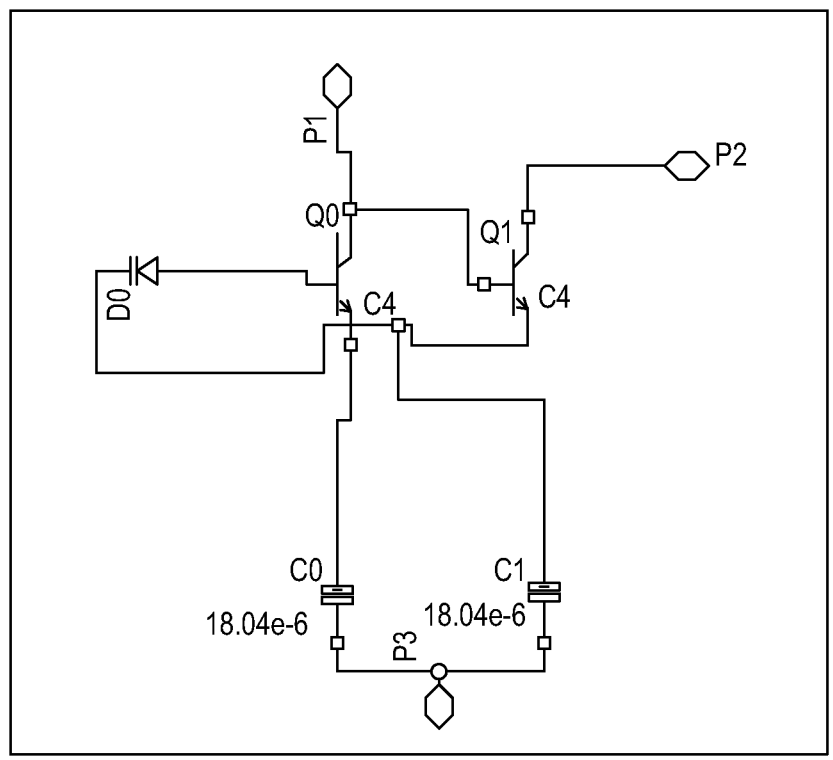

The migration action may be run through the button "Start Migration . . . " and the result of the migration action may be as reported in FIG. 8, in the form of a newly generated "sch_migration" view.

The exemplary migration action considered may imply a component substitution executed with replacement and alignment criteria to be better detailed in the following in connection with the rule file.

It will be appreciated that the modification of parameter "ModelName" may imply a variation of the "npnC" device with respect to the default choice one ("C2").

In certain embodiments the rule file may include four main sections, namely:

GENERAL RULES, containing general information of interest all components to be migrated;

SCHEMATIC SECTION, containing migration information tied to the schematic view;

LAYOUT SECTION, containing migration information tied to the layout view; and

MIGRATION RULES containing a series of declarations pertinent to the single device family to be migrated.

The symbol # is used as a comment mark. The file may end with the declaration END_RULES.

In various embodiments, in the section entitled General Rules we include the following commands:

ERROR_LAYER

This may specify the DFII layer where the error marker may be displayed. An error marker may be used by the tool when a constraint has not been respected during the placement steps. This declaration may specify the layer name and the purpose separated by "I" symbol.

Syntax:

---
ERROR_LAYER = marker/error
TEMP_LAYER
---

This may specify a DFII layer where temporary internal operation of the tool will be executed.

INCLUDE_LAYER

This may specify a DFII layer for the selection of a portion of area wherein the layout migration will be executed. A partial overlap between this layer and a component may suffice so that one will be enclosed among the components to be migrated.

Syntax:

---
INCLUDE_LAYER = y0
ALLOWED_ROT
---

This may specify all the possible rotation angles which the instance may assume in order to not violate constraints. In certain embodiments, the values allowed may be four, namely 0°, 90°, 180°, 270°. This sequence of values may be used as default values when a rotation constraint is specified at cell level rule (see also TARGET_ROT below).

Syntax:

---
ALLOWED_ROT = 0, 90, 180,270
USE_COMBINED_LIBRARY
---

This option may permit managing a combined library. By specifying this statement, the tool may search for the real library name of a device belonging to a combined library. A parameter may specify the name of the combined library usually created after a Design it setup.

Syntax:

---
USE_COMBINED_LIBRARY = DK_REFLIB_cu_4m
VARS
---

This option may make it possible to specify a list of variables that may be used in the rule file in the section relative the parameter management (see below).

Syntax:

VARS: lambda1=2, lamda2=4

In various embodiments, the Schematic Section may include the following commands:

SCH_CHECK_OV

This option may allow ignoring, in the placing phase, any overlap with pre-existing components in the schematic window. If this option is set to false, the tool will ignore all the rotation tries available for that component and will place it always.

Syntax:

---
SCH_CHECK_OV = false
SCH_DELTA_OV
---

This option may allow specifying a maximum overlap to ignore when a new instance touches instances already placed in the schematic.

Syntax:

SCH_DELTA_OV=1.0

In various embodiments, the Layout Section may include the following commands:

LAY_CHECK_OV

This option may allow ignoring, in the placing phase, any overlap with pre-existing components in the layout (cell instances and pins). If this option is set to false, the tool will ignore all the rotation tries available for that component and will place it always by using the original device rotation.

Syntax:

---
LAY_CHECK_OV = false
LAY_DELTA_OV
---

This option may allow specifying a maximum tolerable overlap value between a new instance and those previously existing in the layout which may be ignored.

Syntax:

---
LAY_DELTA_OV = 1.0
LAY_CHECK_PIN_OVERLAP
---

This may allow checking and avoiding any overlapping between instances and pins. It may operate only when LAY_CHECK_OV flag is set to true. If LAY_CHECK_PIN_OVERLAP is set to false (default is true), the target instance, in its placing tries, cannot produce overlapping with other instances already migrated save for existing pins that could be overlapped without causing any violation.

Syntax:

---
LAY_CHECK_PIN_OVERLAP = false
REMOVE_CONV_PATH
---

Figure 9:
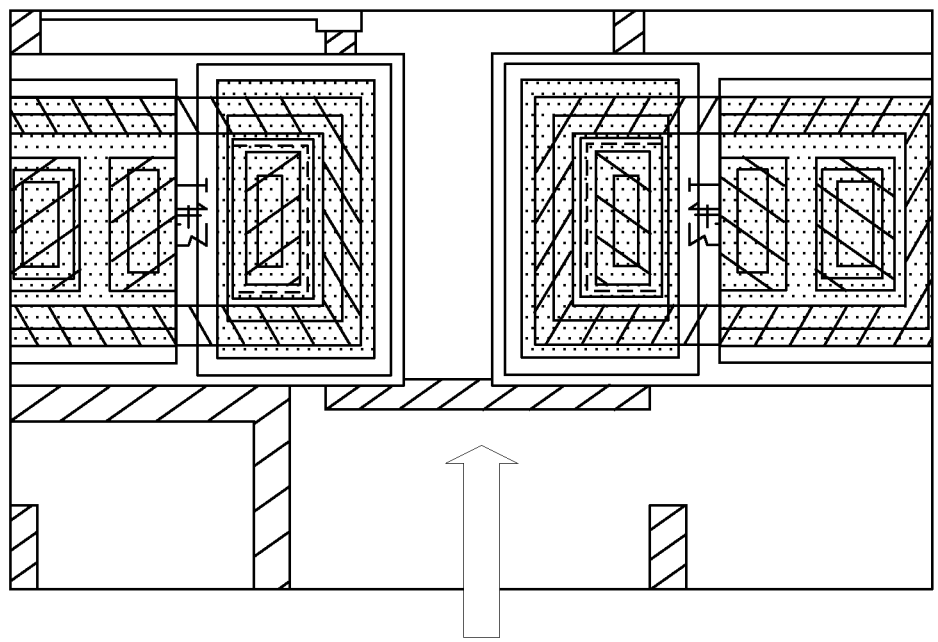

This option may make it possible to delete any metal path object that, after chopping, has been converted into one or more polygons. FIG. 9 schematically shows a metal path converted into a polygon after a chopping action executed by the tool. The arrow indicates the portion of metal that may be possibly removed if the described option is set to "true".

Syntax:

---
REMOVE_CONV_PATH = true
LAY_MANTAIN_ROUTING
---

This option may allow avoiding that the layers listed in the METAL_LAYER statement considered below are chopped. This function may be equivalent to deleting these layers from the METAL_LAYER statement.

Syntax:

```
LAY_MANTAIN_ROUTING = false
FLAT_MOSAIC_INST
```

If set to "true", this option may allow making "flat" the array mosaic instances that include components to be migrated. If this option is set to "false", the "mosaic" components will be ignored during migration step.

Syntax:

```
FLAT_MOSAIC_INST = true
METAL_LAYER
```

This option may indicate the database layers that should be treated as metals. All these layers, by default, may be chopped.

Syntax:

```
METAL_LAYER = MTL1,MTL2,MTL3
VIA_INSTANCES
```

This option may indicate those instance names in the database that should be treated as "vias". These instances may be removed if the "chopping" function is set to "true".

Syntax:

```
VIA_INSTANCES = M1_M2,M2_M3
ALIGN_ORIGIN
```

If this flag is set to true, the tool may use, as placement alignment point, the cell origin xy between source and target cells. This feature may be useful if the source device is a malformed cellView.

Syntax:
ALIGN_ORIGIN=true

In certain embodiments, the section Layers Migration Rules may refer to simple layers migration. This section may make it possible to substitute a layer in all the designs. In order to execute such modification, two statements as reported below may be specified:

```
START_LAYER = metal1/drawing
TARGET_LAYER = metal2/drawing
```

The START_LAYER may define the starting layer based on a specification of a layer/purpose pair.

The TARGET_LAYER may define the destination layer based on a specification of a layer/purpose pair.

The layer migration may be intended to current hierarchy level. The shape of the start layer inside cell blocks may be ignored. If wishing to migrate "everything" the user may have to run a hierarchy migration.

In certain embodiments, the section Devices Migration Rules may be characterized by the fact that each single block of declarations may be referred to the migration of a single typology of cell. These blocks may be repeated several times for different classes of components.

By way of exemplary embodiment, one may analyze in detail the contents of a single block comprised of four rows.

```
START_DEV:devices_symbols,npnB,C
TARGET_DEV:devices_symbols,npnC,C
TARGET_ROT: _ALL_
TARGET_PARAM: ModelName = C4
MAP_NETS: _MATCH_
START_DEV
```

This may define data of the starting cell to be migrated. The name of the library to which the cells belong, the name of the cell and a reference terminal where to effect the alignment may be specified. Alignment may be effected at the pin level by overlapping both cells (starting and target one) in the intermediate points of the boundary box of the shape onto which the reference pin lies and by considering one of the rotations allowed (see below). If the placement of the target cell does not violate any constraints (for example no instances or pins are overlapped by the boundary box of the target cell) the placement is maintained. Otherwise, another try is effected by changing the orientation of the target with the same alignment methodology mentioned before.

Figure 10:
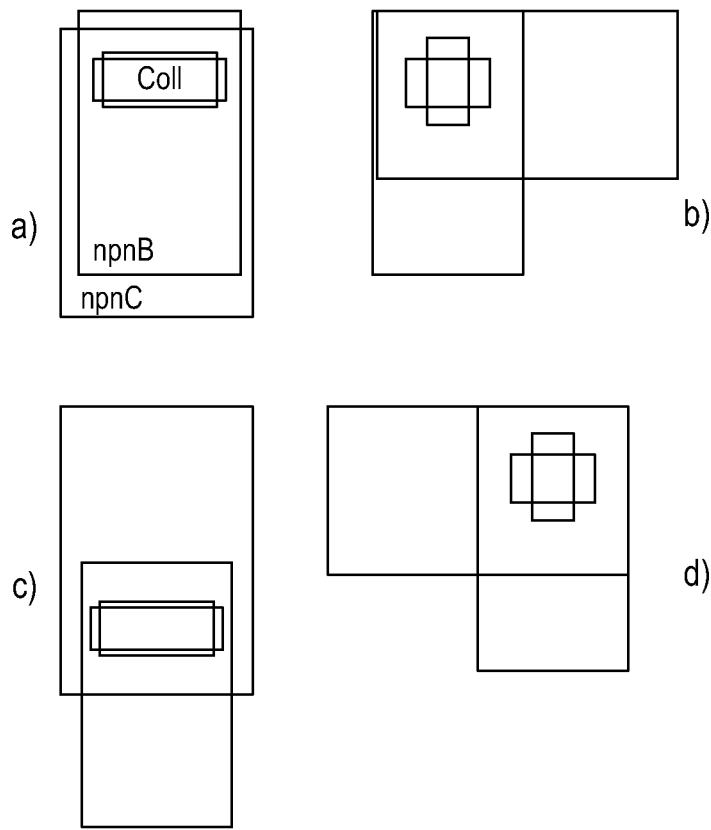

FIG. 10 includes four portions designated a), b), c), and d) referring to an exemplary embodiment where four placement attempts ("tries") are executed with different rotation values (namely 0°, 90°, 180°, and 270°, respectively).

Figure 11:
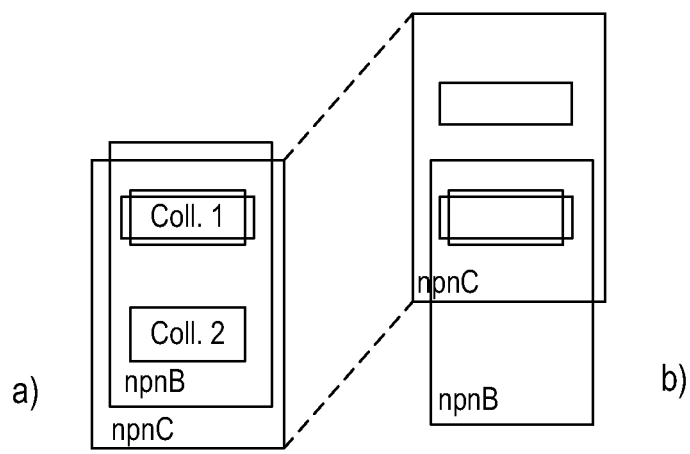

In the exemplary case, one of the two components had two or more collectors, the placing tries may be effected by permuting the contacts before alignment as schematically illustrated in FIG. 11. There, the portion designated a) refers to a placement try of a "npnC" with alignment of a first contact (Collector 1), while the portion designated b) refers to a placement try of a "npnC" with alignment of a second contact (Collector 2).

The correct placement of the target instance may imply cancellation of the starting (i.e. source) instance and transferring connectivity information to the target device.

Syntax:

```
START_DEV:devices_symbols,npnB,C
TARGET_DEV
```

This may define data for the target cell. As for the START_DEV statement, the name of the target library, the name of the cell and the name of the contact used for the alignment may be specified. The source reference contact and the target reference contact may be coincident, but this may not always be the case.

Syntax:

```
TARGET_DEV: devices_symbols,npnC,C
MAP_NETS
```

This may define the mapping of connectivity between the starting cell and the destination (i.e. target) one. The keyword _MATCH_ may indicate that the original connectivity of the starting cell will be transferred without modification on the target device. If, conversely, a mapping is used such as e.g.:

C>PLUS,E>MINUS

As specified, this may indicate a remapping, i.e. that the connectivity of terminal "C" will be transferred to the target "PLUS" terminal while the connectivity of terminal "E" will be transferred to "MINUS" terminal.

It will be appreciated that this case may occur when migrating an original cell with a totally different target cell (for example a substitution of a resistance with a capacitance . . . )

As a further example, a mapping such as:

C>PLUS, E>nil may cause the E terminal to be left disconnected if the REMOVE_AND_WIRE option is set to true.

Syntax:

```
MAP_NETS: _MATCH_
TARGET_ROT
```

This may define the allowed rotation for the placing of these cells. This possibility could be a subset in the set of options defined in ALLOWED_ROT. In various embodiments, this parameter may assume the following values:

_ALL_ to indicate that all the values defined in ALLOWED_ROT are accepted;

_MATCH_ to indicate that the only value accepted for rotation is the one relative to the starting cell;

_MATCHR_{rotation}_ to indicate that rotation has to be matched with the starting cell (as _MATCH_) but an additional rotation may be added. This may be useful when the target component has a pin disposition different from the original one.

0,90,180,270 may indicate specific angles allowed for rotation.

Syntax:

```
TARGET_ROT: 0,90
TARGET_ROT: _MATCH_
TARGET_ROT: _MATCHR_MX_
TARGET_PARAM
```

This may indicate the values that the parameters shall assume after migration. In this command, one may specify the name of the parameter and the value it will assume. As for the TARGET_ROT statement, the keyword _MATCH_ may be accepted. If a certain parameter is not specified in TARGET_PARAMETER, this will assume the default value of the target cell. The _MATCH_ keyword may indicate that the destination parameter will assume the same value of that starting cell. Multiple declarations of this statement for several parameters may be allowed.

Syntax:

EXAMPLE 1

Base Setting

```
TARGET_PARAM: ModelName = C4
TARGET_PARAM: LatoLeft = _MATCH_
```

EXAMPLE 2

Parameter Processing by Using the Native Framework Script Language, e.g.

```
TARGET_PARAM: column = max(_MATCH_ - 1 1)
TARGET_PARAM: w = if(equal(P->l 30e-6) then P->w*1.2 else P->w)
TARGET_PARAM: ModelName = strcat("C" substring(_MATCH_ 2 1))
TARGET_PARAM: bn2 = sprintf(nil "%s" 'P->bn)
```

Where max, if-then-else, equal, strcat, substring and sprintf are standard Skill functions.

EXAMPLE 3

Variable Management

TARGET_PARAM: column=_MATCH_*lambda1

Where lambda1 is a variable defined with the rule deck statement VARS.

EXAMPLE 4

Accessing Multiple Properties in an Instance Without a Complete Master Available (Malformed or Partial Source Instance Information)

```
TARGET_PARAM: width = p->w*1e6
TARGET_PARAM: width = p->w*p->l*1e6
```

In this case, the information contained in the property w of the instance may be accessed through the operator p→ (p is lowercase). In certain embodiments a property may differ from a standard cell parameter (CDF) being a primitive kind of information stored in the database that could rescind from having a 100% of data integrity (malformed cells due some DB errors). No callback functions may be associated with properties.

EXAMPLE 5

Accessing Multiple CDF Parameters

```
TARGET_PARAM: width = P->w*1e6
TARGET_PARAM: width = P->w*P->l*1e6
```

In this case the information contained in the CDF parameter w of the instance is accessed through the operator P→ (P is uppercase).

EXAMPLE 6

Managing Global Nets

```
TARGET_PARAM: bn = sprintf(nil "%s" 'p->bn)
TARGET_PARAM: bn = 'p->bn ; property case
TARGET_PARAM: bn = 'P->bn ; cdf param case
```

In this case, p→bn may contain, for example, vdd!. Global net containing ! symbol is being managed.

EXAMPLE 7

Transfer Connectivity from Node to CDF Parameter

TARGET_PARAM: bn=netset:C

Through the keyword netset, it may be possible to set the value of the parameter bn to the value of the net assigned to the C instance terminal of source device. If, for example, C is connected to gnd!, bn will be assigned to gnd!.

EXAMPLE 8

Switch-Case Like Implementation in Complex Cyclic Fields Management

The parameters are processed sequentially, so that for the same parameter one may define a complex option selection as in the exemplary case reported below:

```
TARGET_PARAM: extrail = if(equal(substring(sprintf(nil "%s" 'P-
>CHANNELSTOP) 1 1) "M") then 25 else 45)
TARGET_PARAM: extrail = if(equal(substring(sprintf(nil "%s" 'P-
>CHANNELSTOP) 1 1) "L") then 5)
TARGET_PARAM: extrail = if(equal(substring(sprintf(nil "%s" 'P-
>CHANNELSTOP) 1 1)"C")then 1.8)
TARGET_PARAM: extrail = if(equal('P->CHANNELSTOP
'REQUIRED) then nil)
```

In this case, in the start device one may have a cyclic type parameter named CHANNELSTOP that could contain the following values ("REQUIRED" "CC" "LC" "MC" "HC" "JC") while in the target device we have a cyclic parameter named extrail containing the following values ("1.8" "5" "12" "25" "45").

The code may be processed in the following way.

If the first letter of CHANNELSTOP (managed as a symbol) is "M" then extrail will be set to 25 otherwise to 45. If the letter is "L", it will be re-set to 5 and finally, if the value is "C", the final set will be 1.8. The last case leaves the default value if CHANNELSTOP is set to REQUIRED.

REMOVE_AND_WIRE

This keyword may allow rerouting only for the current component. This may be useful, for example, if the target component has a size and pin positions different from the start one. An advantage with respect to the global setting may lie in that one may obtain only the minimum necessary rerouting, leaving all the remaining wires as in the original schematic. If not specified, the default will be set as false.

Syntax:
REMOVE_AND_WIRE: true

The Change Library Reference Tool may allow changing libraries' references of instances in hierarchical designs. This tool may be an extension of the "Rename Reference Library" available from Cadence Design Systems, Inc. of 555 River Oaks Parkway, San Jose, Calif.

This tool may be useful for a full design migration presetting operations from a Design Kit (DK) to another one.

A condition for these procedures to work correctly may be that the instances may have masters available both before and after the new assignments made by the tool. Consequently, possible "blinking" instances due to errors may not be allowed in the design in this phase.

A corresponding tool form may include fields designated "Migration Scope" and "Cell kind impact" in order to be able to view how the design process is being traversed (top/hierarchy/library).

Another field designated "Found Cells" may report all the cells with reference to the scope and other criterion selected. If the scope is "top" or "hierarchy", only schematic or layout cells may be listed in relation of the type top cell.

In schematics migration cases, if "library" is selected as the scope, all schematic/layout views may be listed in the field, so that they may be taken into account for next re-referencing phase.

A string field "Indicate only the device symbols libraries" at the beginning may permit locating and seeing all the libraries found in the project (in relation to the selected scope).

Libraries may be added or removed and the cell list may be refreshed through a button "Refresh . . . "

A "Lib filter" filter may allow faster libraries selection through the specification of a filter.

A "Default . . . " button may be provided to reset the libraries list to the lines visible at the beginning.

A "ASCII tech file" feature may be provided requiring a technology file to be specified.

A library designated "Ref-Lib name" may be used to copy all the cells copied and to reference the project referenced to.

The boolean button "Take all cells in all cds.lib library (filtered)" (where cds.lib denotes a framework configuration file containing all the file system paths of libraries available in the environment) may allow to list all devices related to cds.lib linked libraries in the list field. These libraries will be filtered through "Lib filter" field.

This function may be useful for creating a self-consistent library containing all the cells belonging to a multi-library Design Kit.

A boolean button "Take all cells in current listed library" may disable previous Boolean options and allow capturing all the cells of the libraries indicated in the text box list.

The user may change the library lists manually. A button "Create & Change Ref-lib" may allow both creating a self-consistence library and re-referring of all the cells.

A button "Only Change Ref-lib" may allow re-referring to all those cells exploiting a previously created self-consistence library. This last function may make it possible to avoid multiple self-consistence library creation with several different designs to be re-referenced.

In certain embodiments, migrating a design between two Design Kits for a technology migration may involve the following steps:

1) Load a starting design kit with the design to be migrated.
2) Launch a Change Library Reference tool creating a new library (Migration Reference Library) linked to the project
3) Once step 2 is concluded successfully, the current DK may be unloaded while loading the end (or "target") one. At this point, a design may be obtained where all source design instances now refer to the Migration Reference Library.

4) All libraries referring now to the Migration Reference Library may now be re-attached, from the technology point of view, to the Migration Reference Library too. This operation makes it possible to "break" all the links (layout side) with the original technology library.

5) The rule file is compiled, e.g. via the Reinstantiate function and then the migration is launched from the Migration Reference Library (old Design Kit) to devices_symbols (new Design Kit).

Certain embodiments of the tool described herein may be implemented in software form, namely as a computer program product loadable in the memory of a least one computer and including software code portions to implement steps of embodiments as described herein when the product is run on a computer.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method, comprising:
producing, by using a computer, a set of porting rules which translate device information related to at least one device from a source design technology to a target design technology, and
creating a migrated design for the at least one device resulting from porting a CAD design from the source design technology to the target design technology by applying the set of rules to the device information related to said at least one device;
wherein the at least one device has plural device parameters, the method further includes, for each parameter:
reading a parameter setting for the at least one device from the set of rules,
setting the parameter read to a target device in the target design technology; and
unleashing a callback associated to the parameter set to the target device.

2. The method of claim 1, wherein the at least one device is a microelectronics device.

3. The method of claim 1, wherein the at least one device has plural device parameters, the method including, for each parameter:
reading a parameter setting for the at least one device from the set of rules,
setting the parameter read to a target device in the target design technology.

4. The method of claim 3, including, after setting all the plural device parameters to the target device in the target design technology, reading connectivity information from the set of rules and transferring the connectivity information read onto the target device.

5. The method of claim 1, including:
detecting any component overlap resulting from porting the CAD design from the source design technology to the target design technology,
effecting at least one attempt to dispense with component overlap via component rotation.

6. The method of claim 5, including effecting plural attempts to dispense with component overlap via component rotation.

7. The method of claim 5, including effecting at least one attempt to dispense with component overlap via component rotation by selecting a rotation value out of 0°, 90°, 180° and 270°.

8. The method of claim 1, including:
detecting an error due to component overlap resulting from porting the CAD design from the source design technology to the target design technology, and
setting an error flag indicative of the error detected.

9. The method of claim 8, including marking the device which was not properly translated from the source design technology to the target design technology due to the error detected.

10. The method of claim 1, including deleting device paths from the source design technology and reconstructing device paths in the target design technology by applying the set of rules.

11. The method of claim 1, wherein the set of rules includes at least one of:
general rules including information on all components in the at least one device subject to porting from the source design technology to the target design technology migrated;
a section containing migration information tied to the schematic view of the at least one device;
a layout section containing migration information tied to the layout view of the at least one device; and
migration rules containing a series of declarations on the device family to be migrated.

12. A method, comprising:
producing, by using a computer, a set of porting rules which translate device information related to at least one device from a source design technology to a target design technology, and
creating a migrated design for the at least one device resulting from porting a CAD design from the source design technology to the target design technology by applying the set of rules to the device information related to said at least one device;
wherein the at least one device has plural device parameters, the method further includes, for each parameter:
reading a parameter setting for the at least one device from the set of rules,
setting the parameter read to a target device in the target design technology;
creating a default target device instance in the target design technology,
reading a corresponding parameter setting from the set of rules,
applying the parameter read to the target device instance in the target design technology, and
unleashing a callback associated to the parameter set to the target device instance.

* * * * *